United States Patent
Song et al.

(10) Patent No.: US 8,129,214 B2
(45) Date of Patent: Mar. 6, 2012

(54) PHASE CHANGE MEMORY DEVICES HAVING DUAL LOWER ELECTRODES AND METHODS OF FABRICATING THE SAME

(75) Inventors: Yoon-Jong Song, Seoul (KR); Kyung-Chang Ryoo, Gyeonggi-do (KR); Dong-Won Lim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 10 days.

(21) Appl. No.: 12/709,536

(22) Filed: Feb. 22, 2010

(65) Prior Publication Data

US 2010/0144090 A1 Jun. 10, 2010

Related U.S. Application Data

(62) Division of application No. 11/932,781, filed on Oct. 31, 2007, now Pat. No. 7,696,508.

(30) Foreign Application Priority Data

Oct. 31, 2006 (KR) .......................... 10-2006-106532

(51) Int. Cl.
*H01L 21/00* (2006.01)
*H01L 45/00* (2006.01)
(52) U.S. Cl. ...................... 438/95; 438/54; 257/E45.002
(58) Field of Classification Search .................... 438/54, 438/95; 257/E45.002
See application file for complete search history.

(56) References Cited

U.S. PATENT DOCUMENTS

| 6,337,266 | B1 | 1/2002 | Zahorik |
| 6,392,913 | B1 | 5/2002 | Sandhu |
| 6,744,088 | B1 | 6/2004 | Dennison |
| 6,781,145 | B2 * | 8/2004 | Doan et al. ......................... 257/3 |
| 6,815,704 | B1 | 11/2004 | Chen |
| 7,075,131 | B2 | 7/2006 | Chen |
| 7,075,141 | B2 | 7/2006 | Rueckes et al. |
| 7,608,848 | B2 | 10/2009 | Ho et al. |
| 2004/0256694 | A1 * | 12/2004 | Kostylev et al. .............. 257/536 |
| 2007/0051936 | A1 | 3/2007 | Pellizzer et al. |
| 2007/0232015 | A1 | 10/2007 | Liu |

FOREIGN PATENT DOCUMENTS

| KR | 10-2006-0016312 | 2/2006 |
| KR | 10-2006-0110559 | 10/2006 |

OTHER PUBLICATIONS

Ted Kamins, Polycrystalline Silicon for Integrated Circuits and Displays, 1998, Kluwer Acedemic Publishers, p. 165.*

* cited by examiner

*Primary Examiner* — Jerome Jackson, Jr.
*Assistant Examiner* — Paul Budd
(74) *Attorney, Agent, or Firm* — Volentine & Whitt, PLLC

(57) ABSTRACT

A semiconductor device includes a semiconductor substrate and a lower interlayer insulating layer disposed on the substrate. An opening passing through the lower interlayer insulating layer and exposing the substrate is included. A buried insulating pattern is disposed in the opening. First and second conductive layer patterns are sequentially stacked to surround the sidewall and bottom of the buried insulating pattern. A phase change material pattern is included, which is disposed on the lower interlayer insulating layer in contact with a top surface of the second conductive layer pattern, and spaced apart from the first conductive layer pattern. An upper interlayer insulating layer covering the lower interlayer insulating layer and the phase change material pattern is included. A conductive plug is included, which passes through the upper interlayer insulating layer and is electrically connected to the phase change material pattern. A method of fabricating the semiconductor device is also provided.

11 Claims, 15 Drawing Sheets

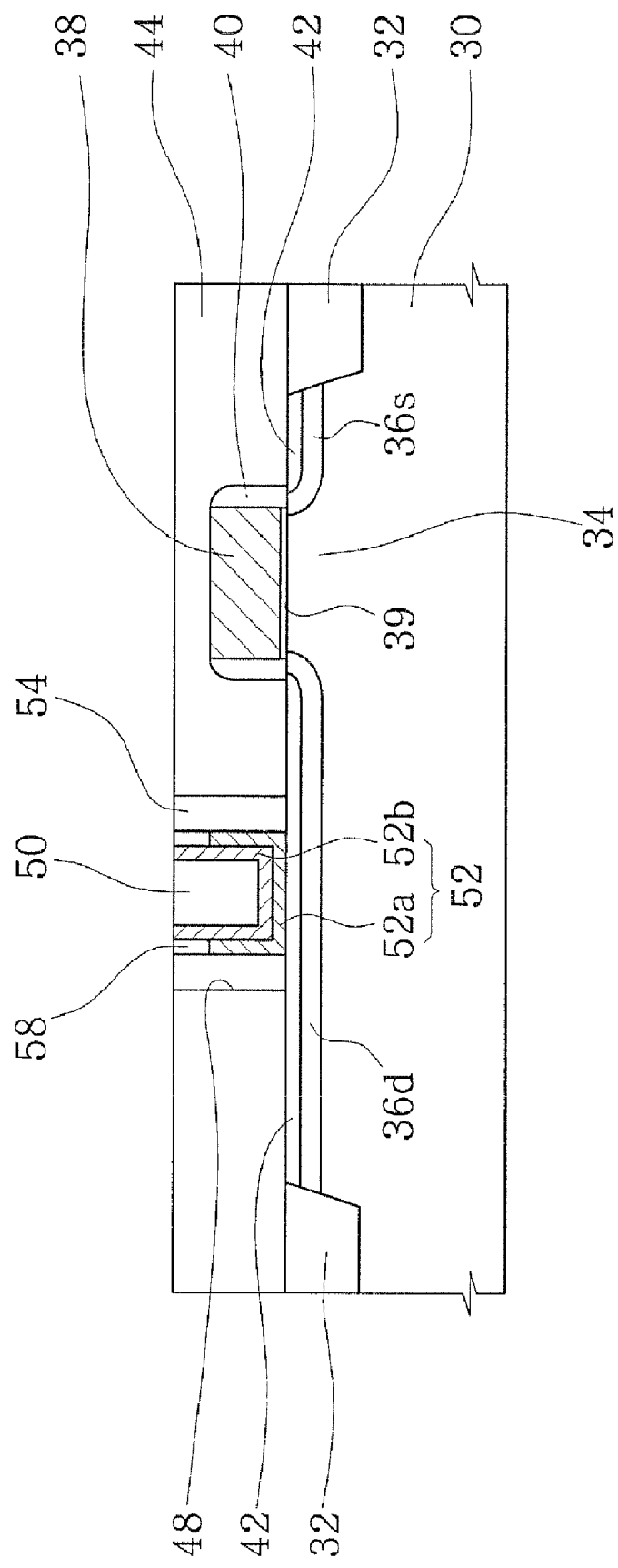

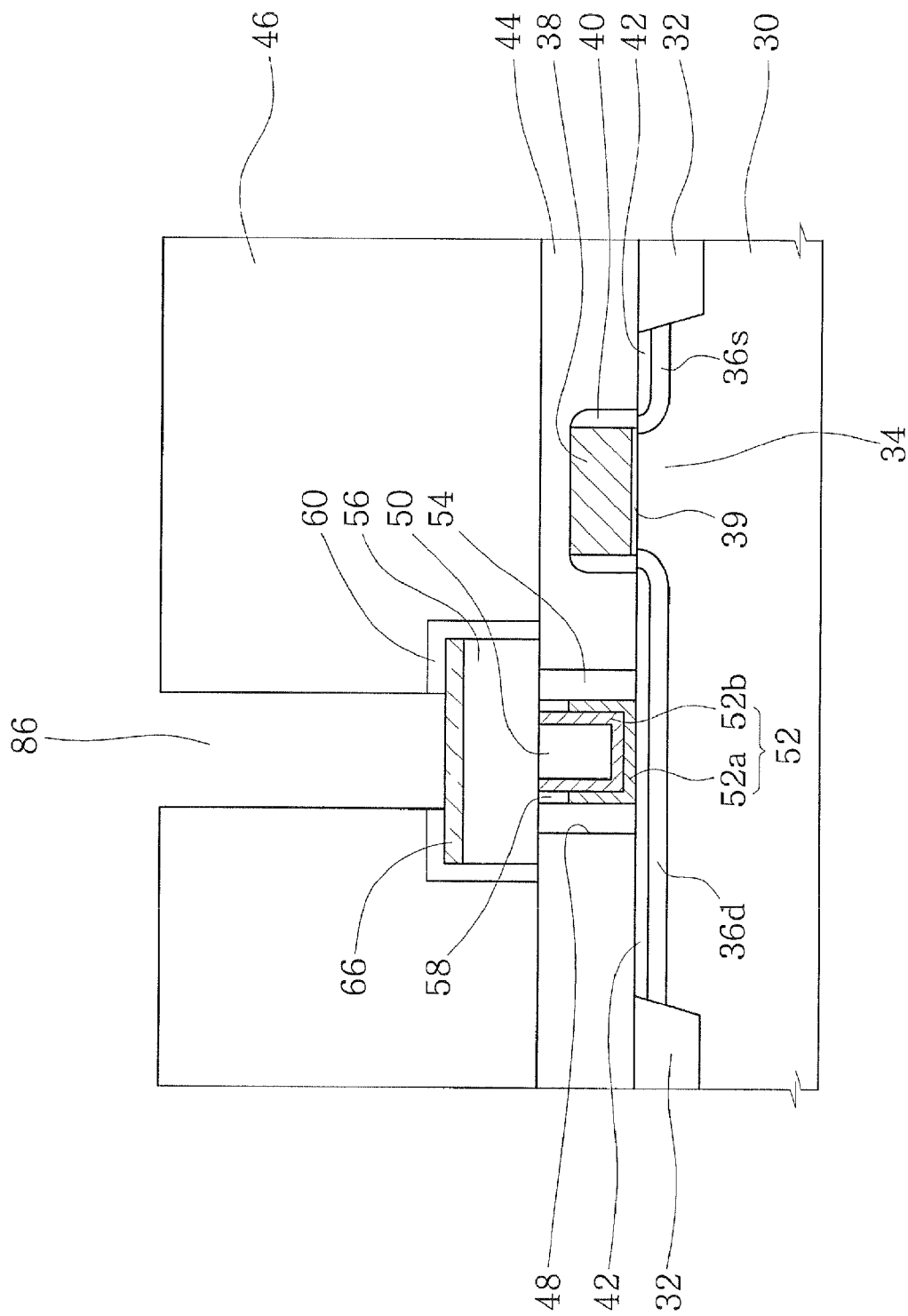

PHASE CHANGE MEMORY DEVICES HAVING DUAL LOWER ELECTRODES AND METHODS OF FABRICATING THE SAME

CROSS-REFERENCE TO RELATED APPLICATION

This application is a Divisional of Application No. 11/932,781, filed Oct. 31, 2007 and claims the benefit of foreign priority to Korean Patent Application No. 2006-106532, filed Oct. 31, 2006, the contents of which are hereby incorporated herein by reference in their entirety.

BACKGROUND

1. Field of Invention

Embodiments of the present invention relate generally to semiconductor devices and methods of fabricating the same. More particularly embodiments of the present invention relate to phase change memory devices having dual lower electrodes, and methods of fabricating the same.

2. Description of Related Art

Recently, a phase change memory device has been proposed as a novel semiconductor device. Phase change memory devices have a nonvolatile characteristic, and thus do not lose data stored therein even if power is interrupted. A unit cell of the phase change memory device includes a switching device and a data storage element serially connected to the switching device. The data storage element comprises a lower electrode, a phase change material pattern disposed on the lower electrode, and an upper electrode disposed on the phase change material pattern. The lower electrode generally serves as a heater. When a write current flows through the switching device and the lower electrode, Joule heat is generated at an interface between the phase change material pattern and the lower electrode. The phase change material is changed to a substantially amorphous or crystalline state by the Joule heat.

FIG. 1 is a cross-sectional view of a conventional phase change memory cell.

Referring to FIG. 1, an interconnection 12 is provided on a semiconductor substrate 10. A molding layer 14 is deposited on the substrate having the interconnection 12. A diode layer 16 passing through the molding layer 14 and electrically connected to the interconnection 12 is disposed. The diode layer 16 is composed of first and second semiconductor patterns 16a and 16b, which are sequentially stacked, and serves as a switching device. An interlayer insulating layer 18 is provided on the molding layer 14. The diode layer 16 is electrically connected to a contact plug 20 passing through the interlayer insulating layer 18. The contact plug 20 serves as a lower electrode. A phase change material pattern 22 covering the contact plug 20 is deposited on the interlayer insulating layer 18. A top surface of the phase change material pattern 22 is in contact with an upper electrode 24. The upper electrode 24 is self-aligned with respect to the phase change material pattern 22 and, therefore, has a width equal to a width of the phase change material pattern 22.

To store desired data in the phase change memory cell having the phase change material pattern 22, a write current flowing through the upper electrode 24, the phase change material pattern 22 and the lower electrode 20 has to be applied. According to an amount of the write current, a phase-changed region 26 of the phase change material pattern 22 in contact with the lower electrode 20 is changed to a substantially crystalline or amorphous state. In this case, since the Joule heat is isotropically supplied into the phase change material pattern 22, the phase change material pattern 22 has a hemisphere-shaped phase-changed region 26 therein.

As the phase change material pattern 22, a chalcogenide material layer, for example, a GeSbTe (GST) layer, is widely used. The GST layer readily reacts with conductive materials such as polysilicon. For example, when the GST layer is in direct contact with polysilicon, silicon atoms in the polysilicon layer diffuse into the GST layer, thereby increasing resistance of the GST layer. As a result, characteristics of the GST layer may deteriorate. Therefore, the lower and upper electrodes 20 and 24 in direct contact with the phase change material pattern 22 are formed of a stable conductive layer which does not react with the phase change material pattern 22. Recently, a metal nitride layer such as a titanium nitride layer has been widely used for the lower and upper electrodes 20 and 24.

To reduce the contact resistance between the lower electrode 20 and the diode layer 16, a metal silicide layer 28 is interposed therebetween. In this case, there is a problem that an ohmic contact is not be formed between the titanium nitride layer forming the lower electrode 20, and the metal silicide layer 28 forming the diode electrode, particularly, between the titanium nitride layer and a cobalt silicide layer.

In addition, semiconductor device are generally required to be fabricated with a high integrity and consume a low amount of power. Accordingly, research aimed at decreasing a program operating current or an erase operating current of the phase change memory cell are progressing. One method for reducing an operating current of the phase change memory cell is increasing resistance of a heater. The increased resistance of the heater has a disadvantage of reducing a sensing margin of the phase change memory cell. Therefore, in order to operate a phase change memory cell at a low operating current, there is a need for a lower electrode which can lower contact resistance at an interface between a switching device and the lower electrode, and increase contact resistance at an interface between the lower electrode and a phase change material pattern.

SUMMARY

Embodiments exemplarily described herein can provide a semiconductor device such as a memory device having dual lower electrodes suitable for optimizing phase change efficiency. Other embodiments exemplarily described herein provide methods of fabricating such semiconductor devices.

One embodiment exemplarily described herein can be generally characterized as a semiconductor device that includes a semiconductor substrate and a phase change material pattern disposed on the substrate. A first conductive layer pattern may be disposed so as to be spaced apart from the phase change material pattern and a second conductive layer pattern may contact the phase change material pattern and a sidewall of the first conductive layer pattern. A buffer pattern may be interposed between the phase change material pattern and the first conductive layer pattern. The buffer pattern may include an oxide containing at least one element constituting the first conductive layer pattern.

Another embodiment exemplarily described herein can be generally characterized as a semiconductor device that includes a semiconductor substrate and a lower interlayer insulating layer disposed on the substrate. An opening may be defined through the lower interlayer insulating layer and exposing the substrate and a buried insulating pattern may be disposed in the opening. First and second conductive layer patterns may be sequentially stacked and surround a sidewall and a bottom surface of the buried insulating pattern. A phase change material pattern may be disposed on the lower interlayer insulating layer, contact a top surface of the second conductive layer pattern and be spaced apart from a top surface of the first conductive layer pattern. A buffer pattern may be interposed between a top surface of the first conductive layer pattern and a bottom surface of the phase change material pattern. The buffer pattern may include an oxide containing at least one element constituting the first conductive layer pattern. An upper interlayer insulating layer may cover the lower interlayer insulating layer and the phase change material pattern and a conductive plug may be disposed through the upper interlayer insulating layer and be electrically connected to the phase change material pattern.

Yet another embodiment exemplarily described herein can be generally characterized as a method of fabricating a semiconductor device. The method may include forming an interlayer insulating layer on a semiconductor substrate and forming an opening within the interlayer insulating layer. The opening may expose the substrate. First and second conductive layer patterns may be sequentially formed to cover a bottom surface and a sidewall of the opening. A buried insulating pattern may be formed within the opening and on the first and second conductive layer patterns. A phase change material pattern may be formed on the first and second conductive layer patterns. The phase change material pattern may contact a top surface of the second conductive layer pattern and be spaced apart from a top surface of the first conductive layer pattern. A buffer pattern may be formed between the top surface of the first conductive layer pattern and a bottom surface of the phase change material pattern. The buffer pattern may include an oxide containing at least one element constituting the first conductive layer pattern. A conductive plug electrically may be formed to connect to the phase change material pattern.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

FIGS. 5A to 5F are cross-sectional views illustrating an exemplary method of fabricating the phase change memory device illustrated in FIG. 2.

DETAILED DESCRIPTION

Figure 1:
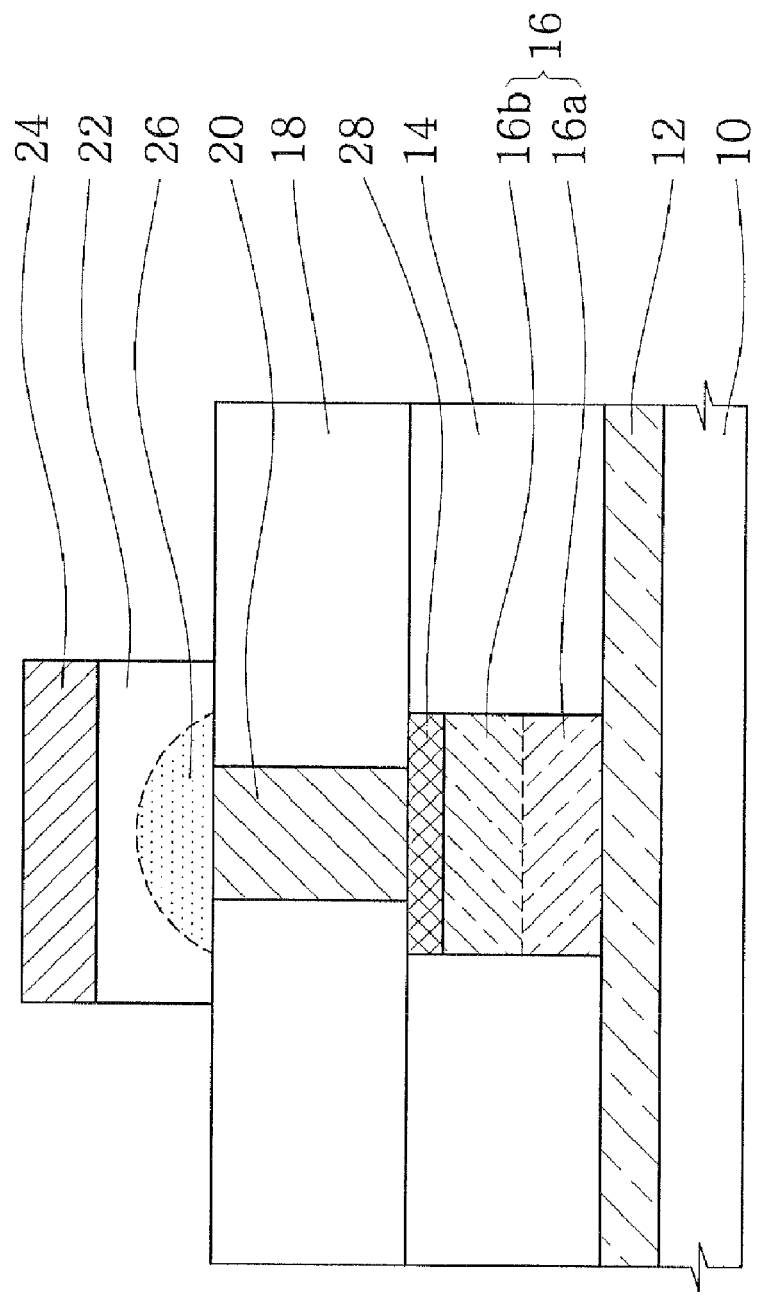
FIG. 1 is a cross-sectional view of a conventional phase change memory cell.

Exemplary embodiments of the present invention will now be described more fully hereinafter with reference to the accompanying drawings. These embodiments may, however, be realized in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements throughout the specification. In addition, when a layer is described to be formed on other layer or on a substrate, which means that the layer may be formed on the other layer or on the substrate, or a third layer may be interposed between the layer and the other layer or the substrate.

Figure 2:
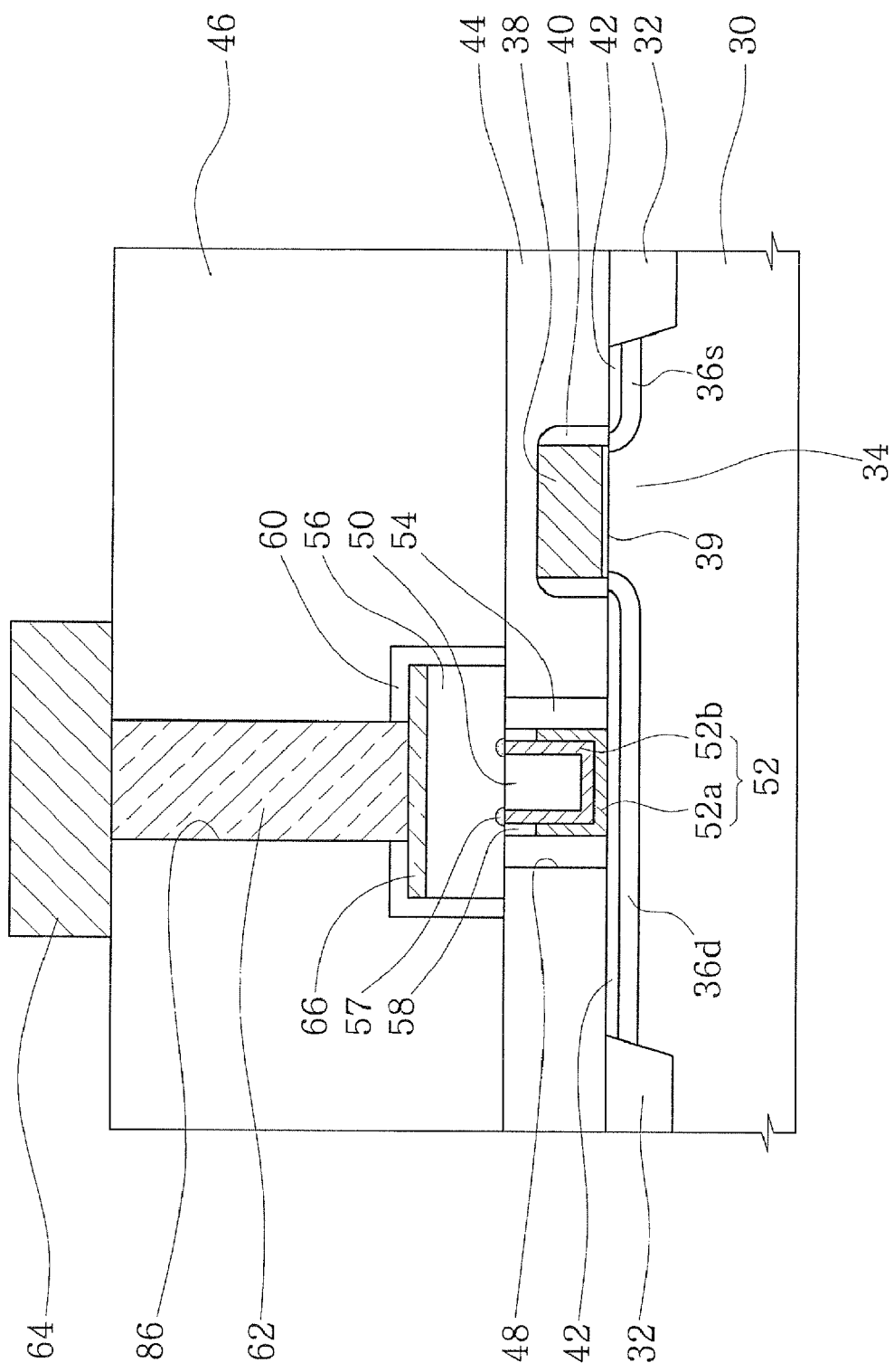
FIG. 2 is a cross-sectional view of a phase change memory device according to one exemplary embodiment.
Figure 3:
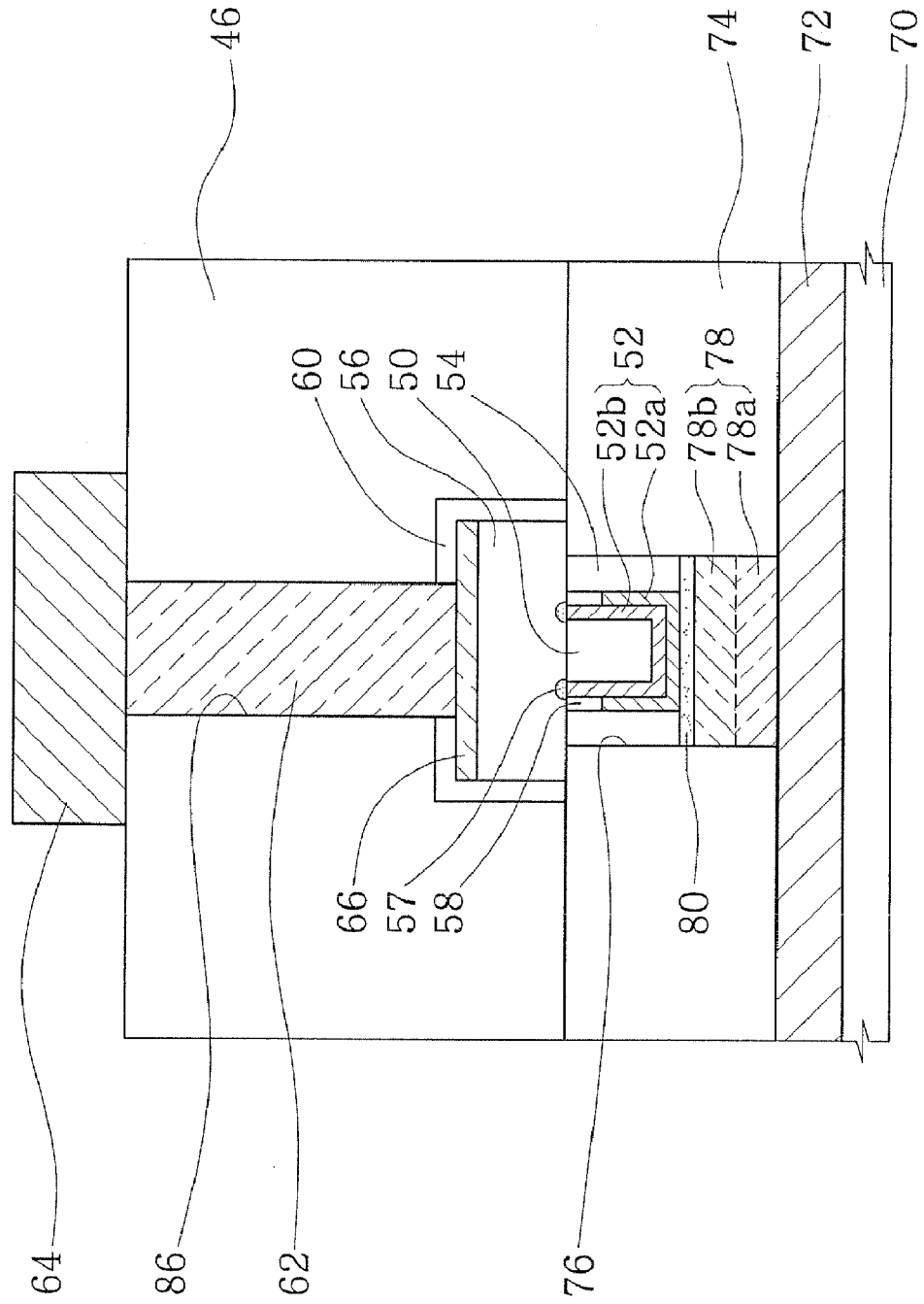
FIG. 3 is a cross-sectional view illustrating a phase change memory device according to another exemplary embodiment.
Figure 4:
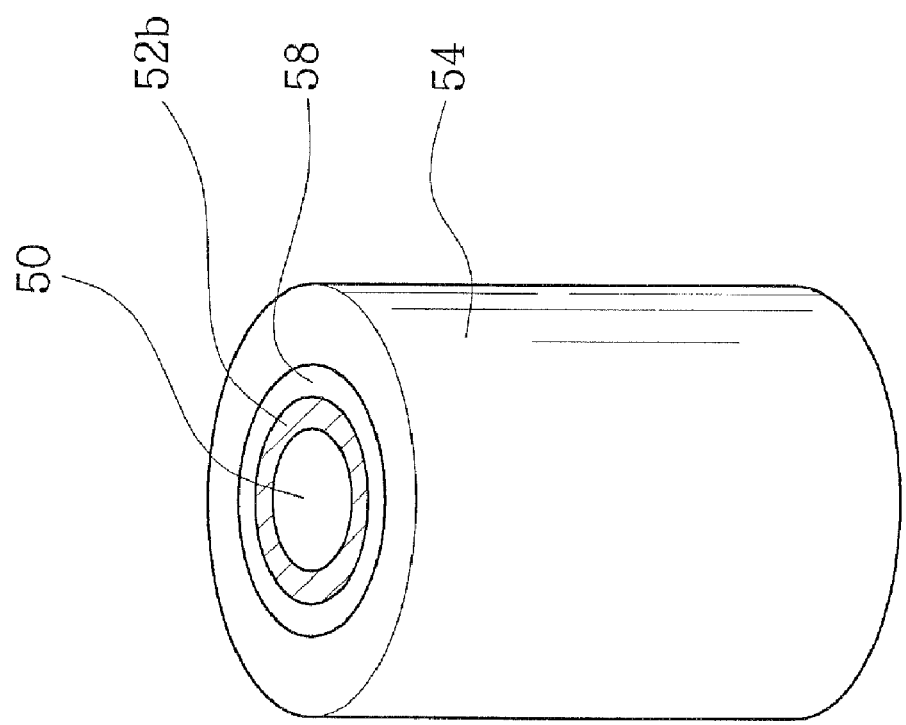
FIG. 4 is a perspective view of a lower electrode of the phase change memory device according to one exemplary embodiment.

FIG. 2 is a cross-sectional view of a phase change memory device according to one exemplary embodiment. FIG. 3 is a cross-sectional view illustrating a phase change memory device according to another exemplary embodiment. FIG. 4 is a perspective view of a lower electrode of the phase change memory device according to one exemplary embodiment. FIGS. 5A to 5F are cross-sectional views illustrating an exemplary method of fabricating the phase change memory device illustrated in FIG. 2. FIGS. 6A to 6E are cross-sectional views illustrating an exemplary method of fabricating the phase change memory device illustrated in FIG. 3.

Referring to FIG. 2, an isolation layer 32 may be provided in a predetermined region on a semiconductor substrate 30. The isolation layer 32 defines an active region 34. A switching device is provided on the active region 34. The switching device may be a MOS transistor, a bipolar transistor, or a diode.

When the switching device is a MOS transistor, the MOS transistor comprises a source region 36s and a drain region 36d which are respectively formed at both ends of the active region 34, and a gate electrode 38 disposed over a channel region between the source and drain regions 36s and 36d. The gate electrode 38 may extend to cross the active region 34. In this case, the gate electrode 38 may serve as a word line. A gate dielectric layer 39 is interposed between the gate electrode 38 and the substrate 30.

Further, gate spacers 40 may be provided on sidewalls of the gate electrode 38. Also, a metal silicide layer 42 may be provided on the source and drain regions 36s and 36d. The metal silicide layer 42 may be formed of cobalt silicide, titanium silicide, or nickel silicide.

The substrate having the MOS transistor is covered with an interlayer insulating layer. The interlayer insulating layer may include a lower interlayer insulating layer 44 and an upper interlayer insulating layer 46, which are sequentially stacked. The lower and upper interlayer insulating layers 44 and 46 may not react with a phase change material layer to be formed in a subsequent process. For example, the lower and upper interlayer insulating layers 44 and 46 may include insulating layers such as silicon oxide layers, silicon nitride layers, or the like or combinations thereof.

An opening 48 may be formed in the lower interlayer insulating layer 44. A predetermined region of the substrate 30 may be exposed through the opening 48. For example, the drain region 36d may be exposed through the opening 48. When the metal silicide layer 42 is provided on the drain region 36d, the metal silicide layer 42 may be exposed through the opening 36d. The opening 48 may be substantially circular in plan view.

A buried insulating pattern 50 may be disposed in the opening 48. The buried insulating pattern 50 may be formed in a substantially circular pillar structure. The buried insulating pattern 50 may, for example, include aluminum oxide ($Al_2O_3$), titanium oxide ($TiO_2$), or the like or combinations thereof.

Sidewalls and a bottom surface of the buried insulating pattern 50 may be covered with first and second conductive layer patterns 52a and 52b, which are sequentially stacked. A top surface of the second conductive layer pattern 52b may be substantially coplanar with a top surface of the lower interlayer insulating layer 44. In addition, a top surface of the first conductive layer pattern 52a may be lower than the top surface of the second conductive layer pattern 52b. In the illustrated embodiment, a bottom surface of the first conductive layer pattern 52a may be in contact with the metal silicide layer 42 on the drain region 36d. However, a bottom surface of the second conductive layer pattern 52b may not be in contact with the metal silicide layer 42.

A drain contact plug (not shown) may be disposed between the first conductive layer pattern 52a and the drain region 36d. In this case, the first conductive layer pattern 52a and the drain region 36d may be electrically connected to each other through the drain contact plug.

The first and second conductive layer patterns 52a and 52b may be formed in a cylindrical shape whose top part is open as illustrated in FIG. 4. Thus, a sidewall of the second conductive layer pattern 52b may be disposed between a sidewall of the buried insulating pattern 50 and a sidewall of the first conductive layer pattern 52a. As such, a bottom of the second conductive layer pattern 52b may be disposed between bottoms of the buried insulating pattern 50 and the first conductive layer pattern 52a. Also, the sidewall of the first conductive layer pattern 52a may be disposed between the sidewall of the second conductive layer pattern 52b and a sidewall of the opening 48. An insulating spacer 54 may also be disposed between the sidewall of the first conductive layer pattern 52a and the sidewall of the opening 48. The first and second conductive layer patterns 52a and 52b constitute a lower electrode 52 of the phase change memory device shown in FIG. 2. The lower electrode 52 may serve as a heater.

In some embodiments, the second conductive layer pattern 52b may be a conductive layer having a higher electrical resistance than the first conductive layer pattern 52a. The first conductive layer pattern 52a may have a thickness that is less than or substantially equal to the thickness of the second conductive layer pattern 52b. In addition, the first conductive layer pattern 52a may oxidize more readily than the second conductive layer pattern 52b. For example, the first conductive layer pattern 52a may include titanium (Ti), titanium nitride (TiN), tantalum (Ta) or the like or a layered combination thereof. In this case, the second conductive layer pattern 52b may, for example, include titanium aluminum nitride (TiAlN). Accordingly, when the first conductive layer pattern 52a is, for example, a Ti layer, a TiN layer or a Ta layer, and the second conductive layer pattern 52b is a TiAlN layer, the first conductive layer pattern 52a may be oxidized in an oxygen atmosphere at about 500° C., but the second conductive layer pattern 52b may not be oxidized.

A phase change material pattern 56 formed on the lower electrode 52 may be disposed in the upper interlayer insulating layer 46. The phase change material pattern 56 may, for example, include a chalcogenide material such as germanium antimony tellurium (GST). In one embodiment, a buffer pattern 58 may be interposed between the top surface of the first conductive layer pattern 52a and the bottom surface of the phase change material pattern 56. The buffer pattern 58 may be interposed between an upper region of the insulating spacer 54 and an upper region of the second conductive layer pattern 52b. The buffer pattern 58 may include an insulating material such as, for example, titanium oxide (TiO), tantalum oxide (TaO), or the like or layered combinations thereof. In some embodiments, the buffer pattern 58 may include an oxide layer containing at least one of the elements constituting the first conductive layer pattern 52a. Accordingly, the top surface of the first conductive layer pattern 52a may be spaced apart from the phase change material pattern 56. The top surfaces of the buffer pattern 58, the second conductive layer pattern 52b and the buried insulating pattern 50 may be disposed at the same level. Thus, an effective contact area for phase change of the phase change material pattern 56 may be limited to the top surface of the second conductive layer pattern 52b that contacts the phase change material pattern 56. As a result, a contact area between the lower electrode 52 and the phase change material pattern 56 is relatively reduced, and thus the phase change efficiency of the phase change material pattern 56 may be improved when a program current flows through the phase change material pattern 56 and the lower electrode 52. In other words, heat generation efficiency at an interface between the lower electrode 52 and the phase change material pattern 56 may be increased, thereby relatively reducing the program current. For example, when the program current flows through the phase change material pattern 56 and the lower electrode 52, the phase change material pattern may have a hemisphere-shaped phase changed region 57 which is formed therein and disposed on the second conductive layer pattern 52b.

In another embodiment, the top surface of the buffer pattern 58 may be substantially coplanar with the top surface of the buried insulating pattern 50 and the top surface of the second conductive layer pattern 52b may be lower than the top surfaces of the buffer pattern 58 and the buried insulating pattern 50. Accordingly, the phase change material pattern 56 may be present within an opening formed between the upper regions of the buffer pattern 58 and the buried insulating pattern 50. In one embodiment, the opening formed between the upper regions of the buffer pattern 58 and the buried insulating pattern 50 may be substantially filled with the phase change material pattern 56. Thereby, the contact area between the second conductive layer pattern 52b and the phase change material pattern 56 may be relatively reduced.

Referring still to FIG. 2, a capping insulating layer 60 covering the phase change material pattern 56 may be provided. The capping insulating layer 60 may protect the phase change material pattern 56. The capping insulating layer 60 may be an insulating layer that does not react with the phase change material pattern 56. For example, the capping insulating layer 60 may include a silicon nitride, silicon oxynitride, or the like or layered combinations thereof. When the upper interlayer insulating layer 46 is formed of the same material as the capping insulating layer 60, the capping insulating layer 60 may be omitted.

An interconnection plug 62 passing through the upper interlayer insulating layer 46 and the capping insulating layer 60 may be provided on the phase change material pattern 56. The interconnection plug 62 may, for example, include titanium, titanium nitride, or the like or layered combinations thereof. An interconnection 64 may be disposed on the interconnection plug 62. The interconnection 64 may include a conductive material such as metal. The interconnection 64 and the phase change material pattern 56 may be electrically connected to each other by the interconnection plug 62. The interconnection plug 62 may serve as an upper electrode. The upper electrode 62, the phase change material pattern 56 and the lower electrode 52 constitute a phase change resistor.

In some embodiments, a conductive barrier layer 66 may be interposed between the interconnection plug 62 and the phase change material pattern 56. The conductive barrier layer 66 may include a conductive material that does not react with the phase change material pattern 56. For example, the conductive barrier layer 66 may include titanium nitride (TiN), tantalum nitride (TaN), tungsten nitride (WN), titanium aluminum nitride (TiAlN), or the like or a combination thereof.

In the illustrated embodiment, the interconnection 64 may serve as a bit line. In this case, the bit line may be disposed to cross the word line.

In one embodiment, the phase change memory device shown in FIG. 2 may employ a MOS transistor as a switching device. In another embodiment, and with reference to FIG. 3, the phase change memory device may employ a diode as a switching device. Elements shown in FIG. 3, except the switching device, are equal or similar to that described above with respect to FIG. 2 and a description thereof will, therefore, be omitted.

Referring to FIG. 3, when the switching device is a diode, the phase change memory device may include an interconnection 72 provided in a predetermined region of a substrate having a first conductivity type. The interconnection 72 may be disposed in an active region defined by an isolation layer (not shown). The interconnection 72 may serve as a word line. The interconnection 72 may have a second conductivity type different from the first conductivity type. In this embodiment, it is assumed that the first and second conductivity types are P and N types for convenience of description, respectively. However, the first and second conductivity types may be N and P types, respectively.

The predetermined region may be exposed through an opening 76 passing through a lower interlayer insulating layer 74. A lower region of the opening 76 may be filled with first and second semiconductor patterns 78a and 78b which are sequentially stacked. The second semiconductor pattern 78b may have the first conductivity type, and the first semiconductor pattern 78a may have the first or second conductivity type. When the first semiconductor pattern 78a has the second conductivity type, the sequentially stacked first and second semiconductor patterns 78a and 78b constitute a cell diode 78. Contrarily, when both the first and second semiconductor patterns 78a and 78b have the first conductivity type, the first semiconductor pattern 78a and the interconnection 72 in contact with the first semiconductor pattern 78a constitute a cell diode.

Even when the first semiconductor pattern 78a has the first or second conductivity type, the first semiconductor pattern 78a may have a lower impurity concentration than the interconnection 72 and the second semiconductor pattern 78b. As a result, a leakage current characteristic of the cell diode may be improved when an inversed bias is applied to the cell diode.

A cell diode electrode 80 may be provided on the surface of the second semiconductor pattern 78b. The cell diode electrode 80 may, for example, include a metal silicide. For example, the cell diode electrode 80 may include a cobalt silicide layer. A lower electrode 52 is provided on the cell diode electrode 80. The lower electrode 52 is disposed in the opening 76. A buried insulating pattern 50 is disposed in the opening 76. The buried insulating pattern 50 may be formed in a substantially circular pillar shape. In the illustrated embodiment, the lower electrode 52 covers the sidewall and bottom of the buried insulating pattern 50. In another embodiment, the lower electrode 52 may have a cylindrical shape with an opened top. The lower electrode 52 may, for example, include first and second conductive layer patterns 52a and 52b, which are sequentially stacked. The first conductive layer pattern 52a may cover the sidewall and bottom of the second conductive layer pattern 52b. Accordingly, a bottom surface of the second conductive layer pattern 52b may be in contact with the cell diode electrode 80. The second conductive layer pattern 52b may be a conductive layer having a higher resistance than the first conductive layer pattern 52a.

Conventional lower electrodes typically form a lower electrode using only a TiN layer. When a TiN layer is employed as the lower electrode, an ohmic contact is not formed between the lower electrode and the cell diode electrode 80. In order to overcome this problem, as shown in the illustrated embodiment, a Ti layer is interposed between a TiN layer and the cell diode electrode 80. Accordingly, the first conductive layer pattern 52a may include a Ti layer and the second conductive layer pattern 52b may include a TiN layer. Accordingly, if the cell diode electrode 80 includes, for example, a cobalt silicide layer, ohmic contact may be formed between the first conductive layer pattern 52a and the cell diode electrode 80. In some embodiments, the first conductive layer pattern 52a may be thinner than the second conductive layer pattern 52b.

A method of fabricating a phase change memory device according to exemplary embodiments of the present invention will be described below.

Figure 5A:
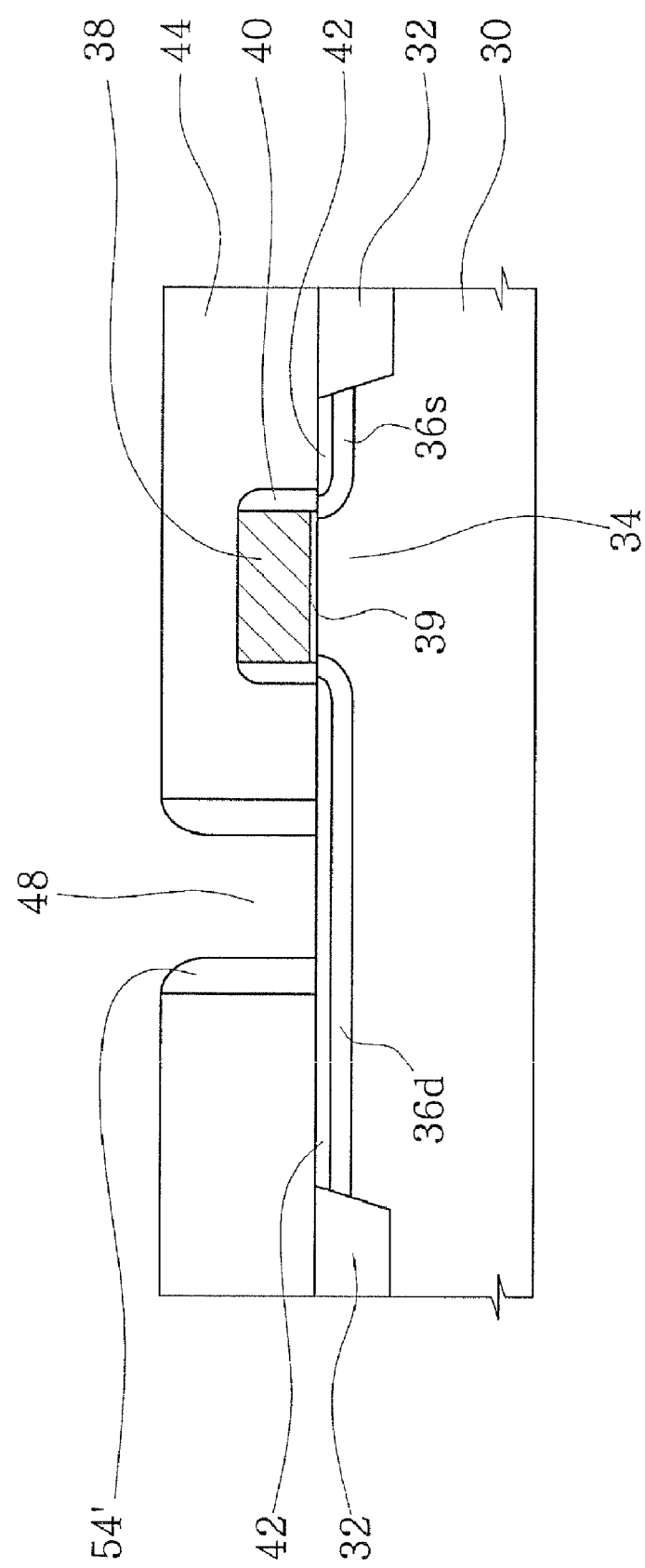

Referring to FIGS. 2 and 5A, a predetermined region of a semiconductor substrate 30 may be etched to form an isolation region 32 defining an active region 34. A gate electrode 38 may be formed on the active region 34. Impurity ions may be injected using the gate electrode 38 as an ion injection mask to form source and drain regions 36s and 36d in the active region 34. Accordingly, the source and drain regions 36s and 36d may be formed under both sides of the gate electrode 38, respectively. A gate spacer 40 covering a sidewall of the gate electrode 38 may also be formed.

As a result, a MOS transistor is completed as a switching device of the phase change memory device according to the exemplary embodiment of the present invention. Accordingly, the MOS transistor includes source and drain regions 36s and 36d, respectively, formed at both ends of the active region 34, and the gate electrode 38 disposed over a channel region between the source and drain regions 36s and 36d. The gate electrode 38 may be formed to cross the active region 34. Here, the gate electrode 38 may serve as a word line.

A metal silicide layer 42 including, for example, cobalt silicide, nickel silicide, titanium silicide, or the like may be formed on the source and drain regions 36s and 36d. The metal silicide layer may be formed using silicide technology which is well known to those skilled in the art.

A lower interlayer insulating layer 44 may then be formed to cover the substrate having the MOS transistor. The lower interlayer insulating layer 44 may be formed of an insulating layer which will not react with a subsequently formed phase change material layer. For example, the lower interlayer insulating layer 44 may include silicon oxide, silicon nitride, or the like, or some layered/unlayered combination thereof.

The lower interlayer insulating layer 44 may be patterned to form an opening 48 exposing the drain region 36d. When the metal silicide layer 42 is formed on the drain region 36d, the metal silicide layer 42 may be exposed through the opening 48. An insulating spacer layer 54' may be formed on a sidewall of the opening 48. The insulating spacer layer 54' may, for example, include an insulating material such as silicon nitride. In one embodiment, the insulating spacer layer 54' may be formed by depositing an insulating layer on the substrate having the opening 48 and anisotropically etching the insulating layer. As a result, the area of the metal silicide layer 42 exposed through the opening having the insulating spacer layer 54' may be reduced.

Figure 5B:
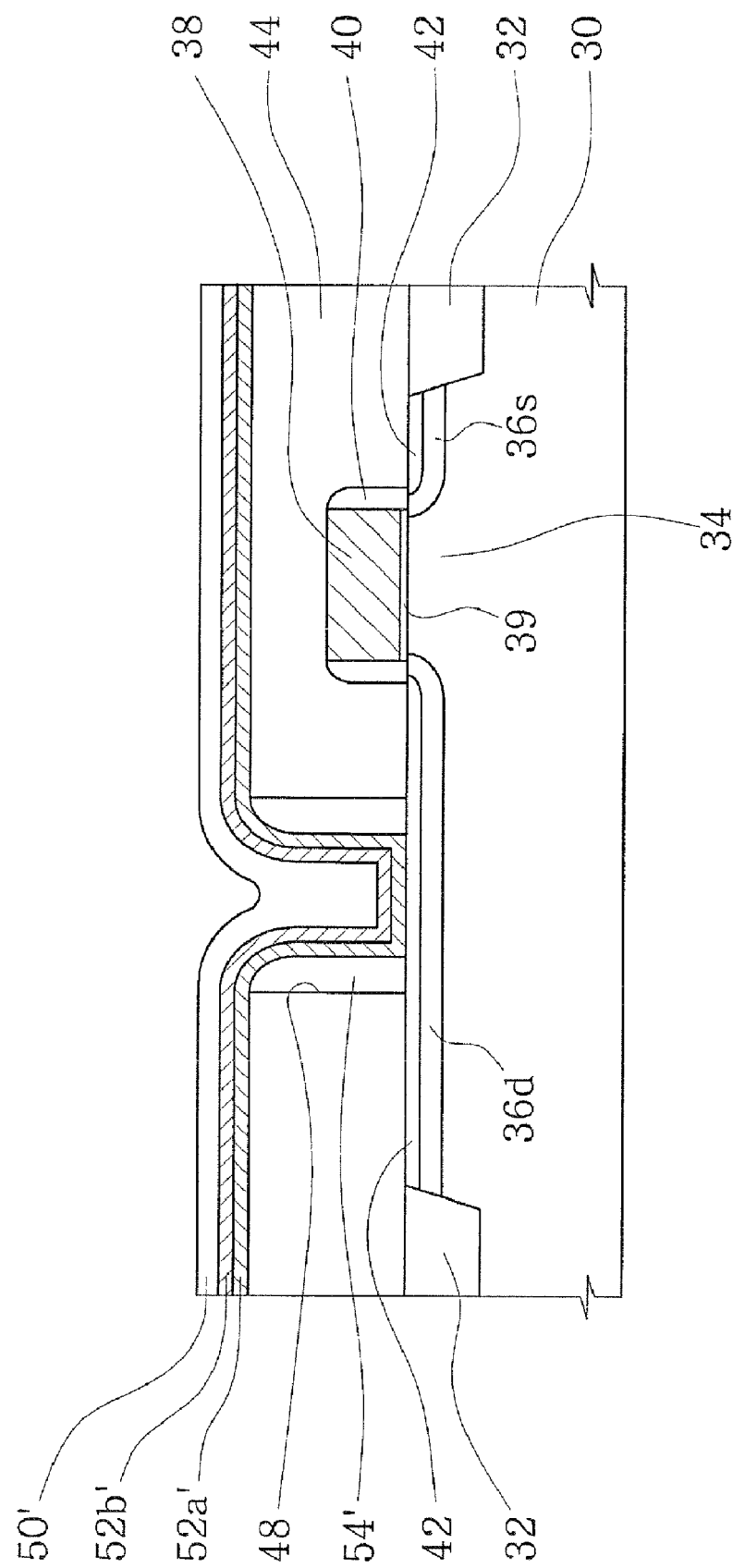

Referring to FIGS. 2 and 5B, a first conductive layer 52a', a second conductive layer 52b' and a buried insulating layer 50' filling the opening 48 may be conformally formed in sequence on the substrate 30 having the insulating spacer layer 54'. In the illustrated embodiment, the first conductive layer 52a' may be formed to contact the metal silicide layer 42 on the drain region 36d. The first conductive layer 52a', the second conductive layer 52b' and the buried insulating layer 50' may, for example, be formed using a chemical vapor deposition (CVD) technique, an atomic layer deposition (ALD) technique, or the like or a combination thereof. The first and second conductive layers 52a' and 52b', and the buried insulating layer 50' may, for example, include materials that do not react with a subsequently formed phase change material layer. In one embodiment, the first conductive layer 52a' may be formed of a conductive material having a lower electrical resistance than the second conductive layer 52b'. In another embodiment, the first conductive layer 52a' may be formed of a conductive material that is more readily oxidized than the second conductive layer 52b'. For example, the first conductive layer 52a' may be formed of a Ti layer, a TiN layer, a Ta layer or a combination thereof, and the second conductive layer 52b' may include a TiAlN layer. In addition, the buried insulating layer 50' may include an $Al_2O_3$ layer or a $TiO_2$ layer.

Figure 5C:
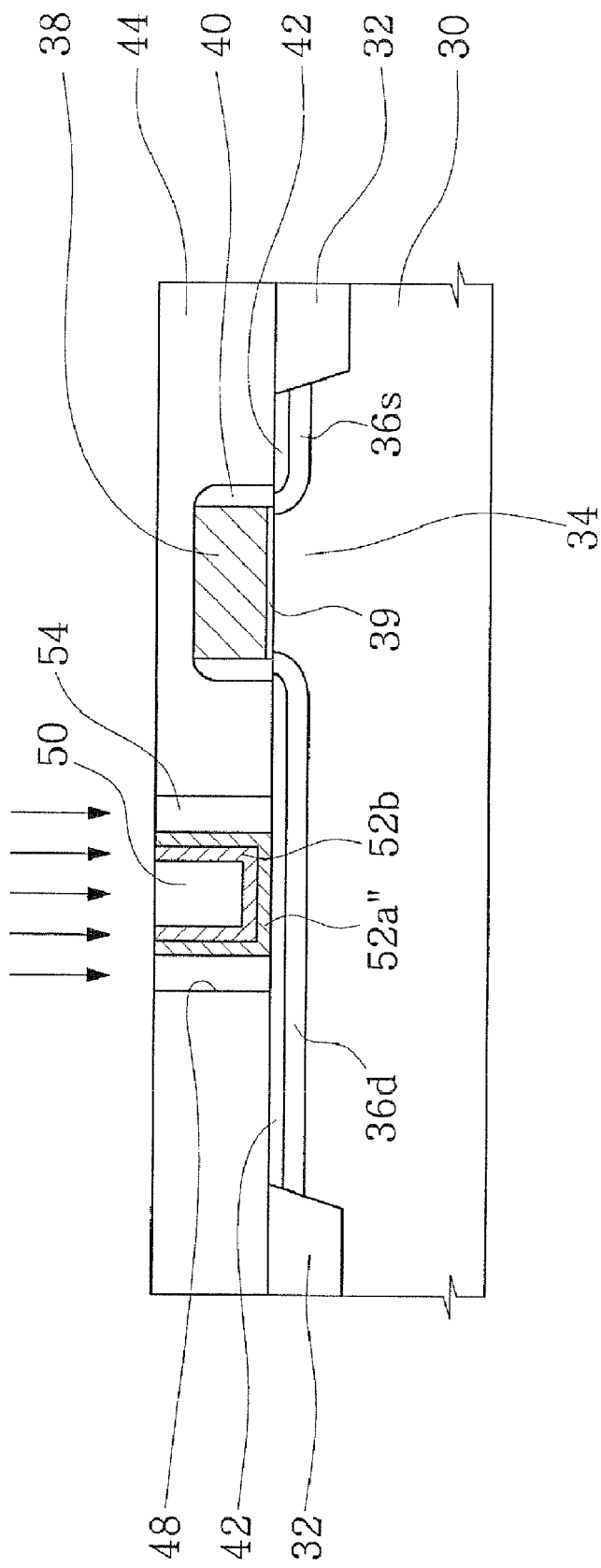

Referring to FIGS. 2, 5C and 5D, the buried insulating layer 50', the second conductive layer 52b', the first conductive layer 52a' and the insulating spacer layer 54' may be sequentially planarized by a chemical mechanical polishing process. Accordingly, a buried insulating pattern 50, a second conductive layer pattern 52b covering the sidewall and bottom of the buried insulating pattern 50, and a preliminary first conductive layer pattern 52a" covering the sidewall and bottom of the second conductive layer pattern 52b are formed in the opening 48. In addition, an insulating spacer 54 may be formed between sidewalls of the opening 48 and preliminary first conductive layer pattern 52a". In one embodiment, a top surface of the preliminary first conductive layer pattern 52a" may be substantially coplanar with a top surface of the buried insulating pattern 50 and the second conductive layer pattern 52b. In another embodiment, the top surfaces of the preliminary first conductive layer pattern 52a" and the second conductive layer pattern 52b may be exposed.

Subsequently, the substrate having the preliminary first conductive layer pattern 52a" and the second conductive layer pattern 52b is then thermally treated or plasma-treated at high temperature and in a vacuum to form a buffer pattern 58 in an upper region of the preliminary first conductive layer pattern 52a". Accordingly, a first conductive layer pattern 52a may be formed to cover a lower region of sidewall and a bottom surface of the second conductive layer pattern 52b. In addition, the buffer pattern 58 may be formed to cover an upper region of sidewall of the second conductive layer pattern 52b. For example, when the substrate having the preliminary first conductive layer pattern 52a" and the second conductive layer pattern 52b is thermally treated or plasma-treated in an oxygen atmosphere at about 500° C., the buffer pattern 58 may be formed as an oxide layer in the upper region of a sidewall of the preliminary first conductive layer pattern 52a", which oxidizes more readily than the second conductive layer pattern 52b, while the second conductive layer pattern 52b is not oxidized (or is not oxidized by a minimal amount). The buffer pattern 58 may, for example, include an insulating material such as TiO, TaO or the like. In top surface of the buffer pattern 58 may be substantially coplanar with the top surface of the second conductive layer pattern 52b.

As described above, a top surface of the preliminary first conductive layer pattern 52a" may be substantially coplanar with a top surface of the second conductive layer pattern 52b. In another embodiment, however, the top surface of the preliminary first conductive layer pattern 52a" may be made lower than the top surface of the second conductive layer pattern 52b by partially etching the upper region of the sidewall of the preliminary first conductive layer pattern 52a" to thereby form the first conductive layer pattern 52a. Accordingly, an opening may be formed between an upper region of sidewall of the insulating spacer 54 and that of the second conductive layer pattern 52b to expose the top surface of the first conductive layer pattern 52a. Then, an insulating material such as TiO, TaO, or the like or a combination thereof may be formed to fill the opening using, for example, a CVD technique. Thus, the buffer pattern 58 may be formed on the top surface of the first conductive layer pattern 52a.

A lower electrode 52 is formed to include the first and second conductive layer patterns 52a and 52b. In some embodiments, the first and second conductive layer patterns 52a and 52b may be formed in a cylindrical shape having an opened top.

In some embodiments, a sidewall of the second conductive layer pattern 52b may be partially etched thereby forming an opening between upper regions of the buffer pattern 58 and the buried insulating pattern 50 that exposes the top surface of the etched second conductive layer pattern. Accordingly, the top surface of the etched second conductive layer pattern may be formed at a lower level than the top surfaces of the buffer pattern 58 and the buried insulating pattern 50. The opening thus formed may be filled with the GST layer.

Although not shown, a drain contact plug may be formed between the metal silicide layer 42 and the lower electrode 52. Accordingly, the metal silicide layer 42 and the lower electrode 52 may be formed to connect with each other through the drain contact plug.

Figure 5E:
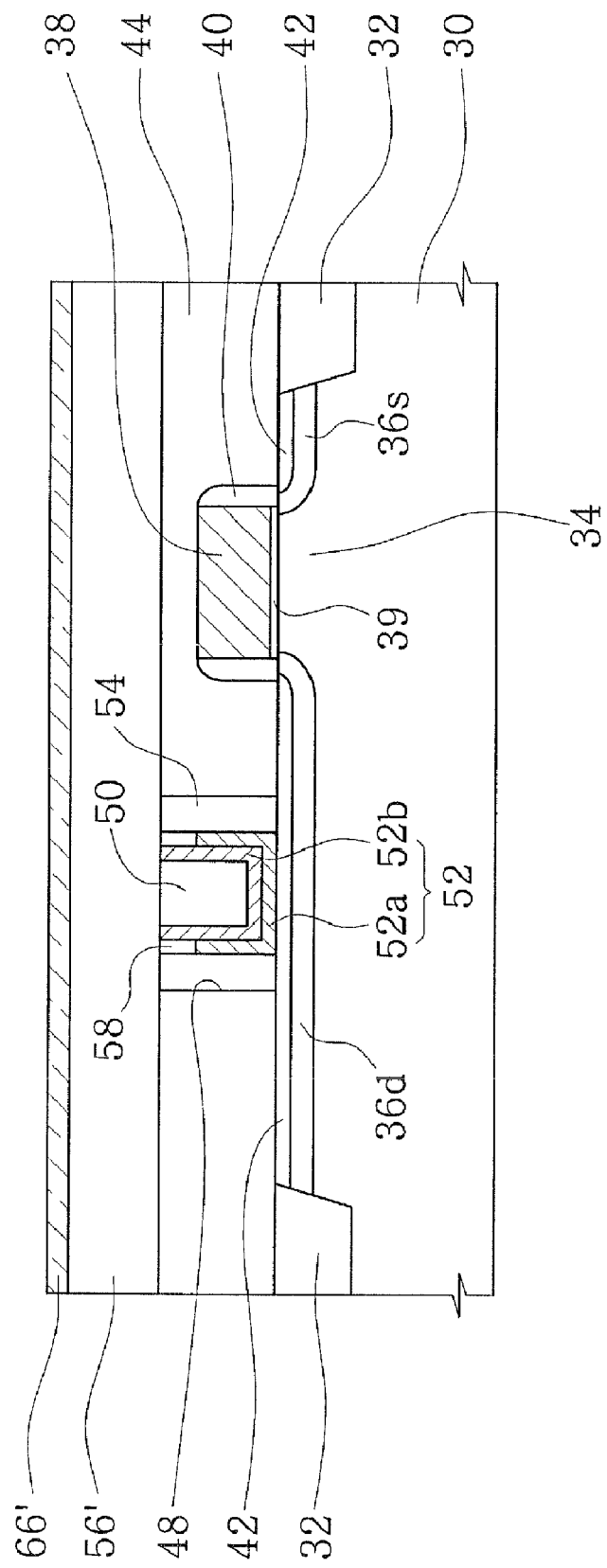

Referring to FIGS. 2 and 5E, a phase change material layer 56' may be formed on the substrate having the buried insulating pattern 50, the lower electrode 52 and the buffer pattern 58. A conductive barrier layer 66' may also be formed on the phase change material layer 56'. The phase change material layer 56' may, for example, include a chalcogenide material such as GST. The conductive barrier layer 66' may, for example, include a conductive material that does not react with the phase change material layer 56'. For example, the conductive barrier layer 66' may include a conductive material such as TiN, TaN, WN, TiAlN, or the like.

Referring to FIGS. 2 and 5F, the conductive barrier layer 66' and the GST layer may be sequentially patterned to form a phase change material pattern 56 and a conductive barrier layer pattern 66 on the lower electrode 52. Then, a capping insulating layer 60 covering the phase change material pattern 56 and the conductive barrier layer pattern 66 may be formed. The capping insulating layer 60 may include an insulating material that does not react with the phase change material pattern 56. For example, the capping insulating layer 60 may include silicon nitride, silicon oxynitride, or the like or a combination thereof.

An upper interlayer insulating layer 46 may be formed on the substrate having the phase change material pattern 56 and the conductive barrier layer pattern 66. The upper interlayer insulating layer 46 may include an insulating material that does not react with the phase change material pattern 56. For example, the upper interlayer insulating layer 46 may include an insulating material such as silicon oxide, silicon nitride, or the like or a combination thereof.

The upper interlayer insulating layer 46 and the capping insulating layer 60 may be sequentially patterned to form an opening 86 that exposes a top surface of the conductive barrier layer pattern 66. A conductive layer may then be formed on the substrate having the opening 86. As a result, the opening 86 may be filled with the conductive layer. The conductive layer may, for example, include a metal such as W, Ti, or the like or a combination thereof. The conductive layer may be etched by an etch-back technique, or planarized by a chemical mechanical polishing technique, to form a conductive plug 62 that fills the opening 86 as shown in FIG. 2. Accordingly, the conductive plug 62 may be formed of a metal layer and may pass through the upper interlayer insulating layer 46. An interconnection 64 may be formed on the upper interlayer insulating layer 46 having the conductive plug 62. The interconnection 64 may, for example, include a metal layer. The interconnection 64 may be electrically connected to the phase change material pattern 56 through the conductive plug 62. The interconnection 64 may serve as a bit line. Thus, the phase change memory device of FIG. 2 may be completed.

A method of fabricating a phase change memory device according to the above-described embodiment was explained by employing a MOS transistor as a switching device. A method of fabricating a phase change memory device employing a diode as a switching device will be described below. In the fabrication method according to another exemplary embodiment to be described below, methods except a fabrication method of the switching device are equal or similar to the above-described method, and thus a description thereof will be omitted.

Figure 6A:
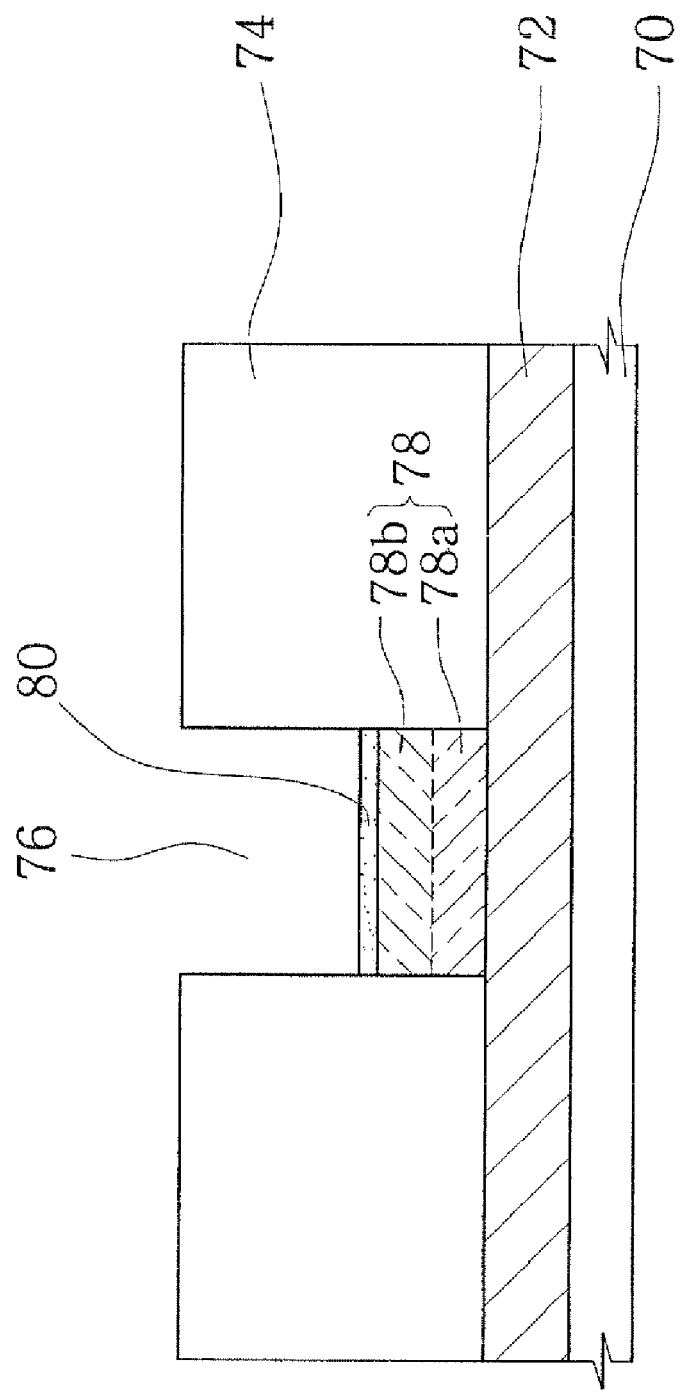
FIGS. 6A to 6E are cross-sectional views illustrating an exemplary method of fabricating the phase change memory device illustrated in FIG. 3.
Figure 6B:
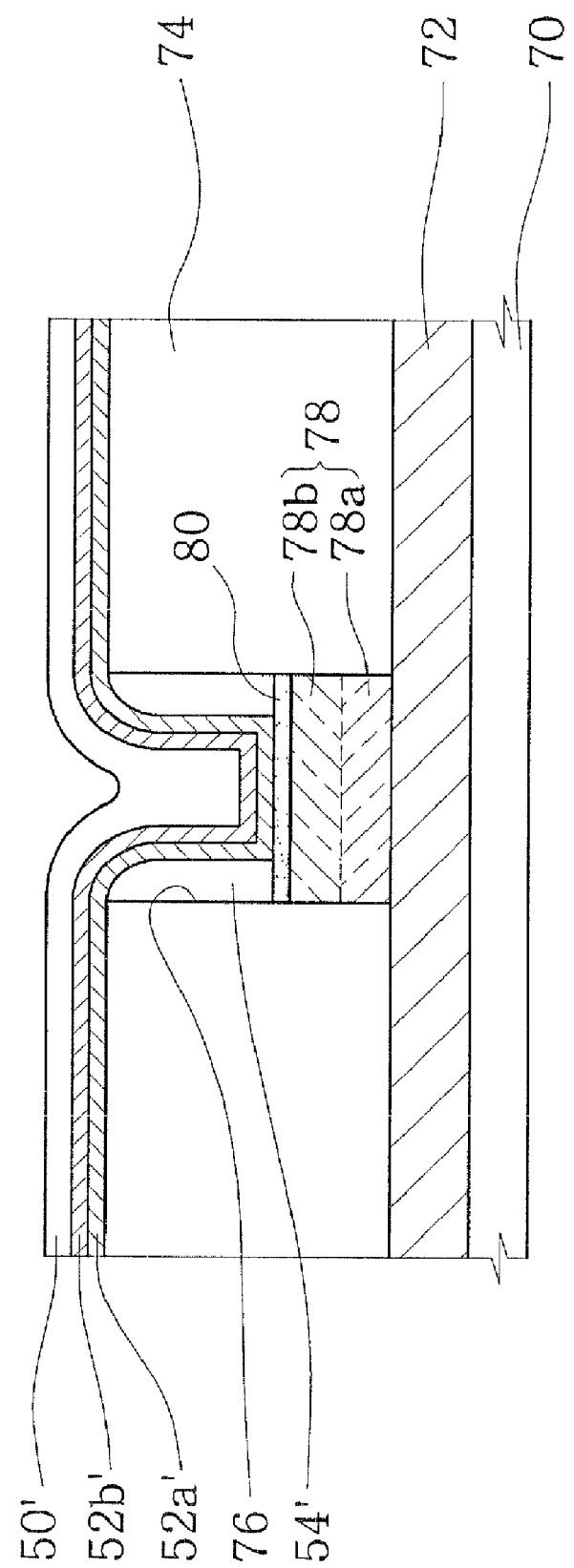
Figure 6C:
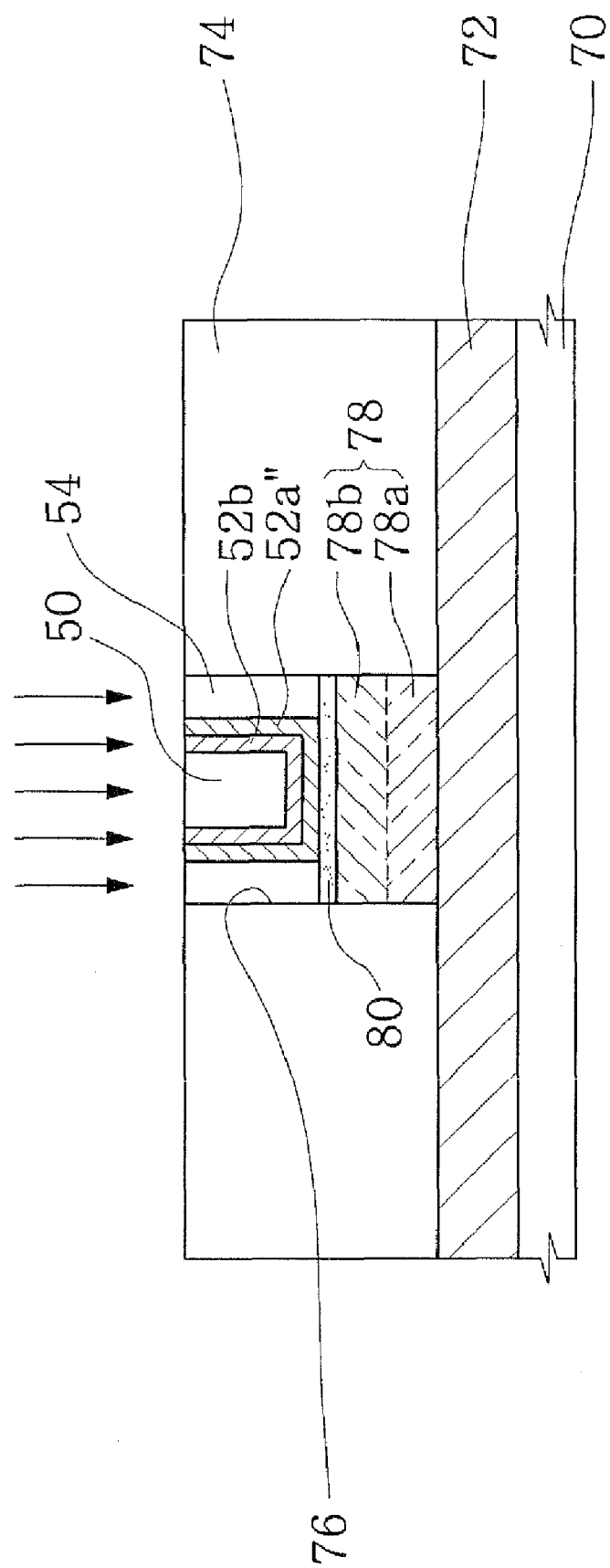
Figure 6D:
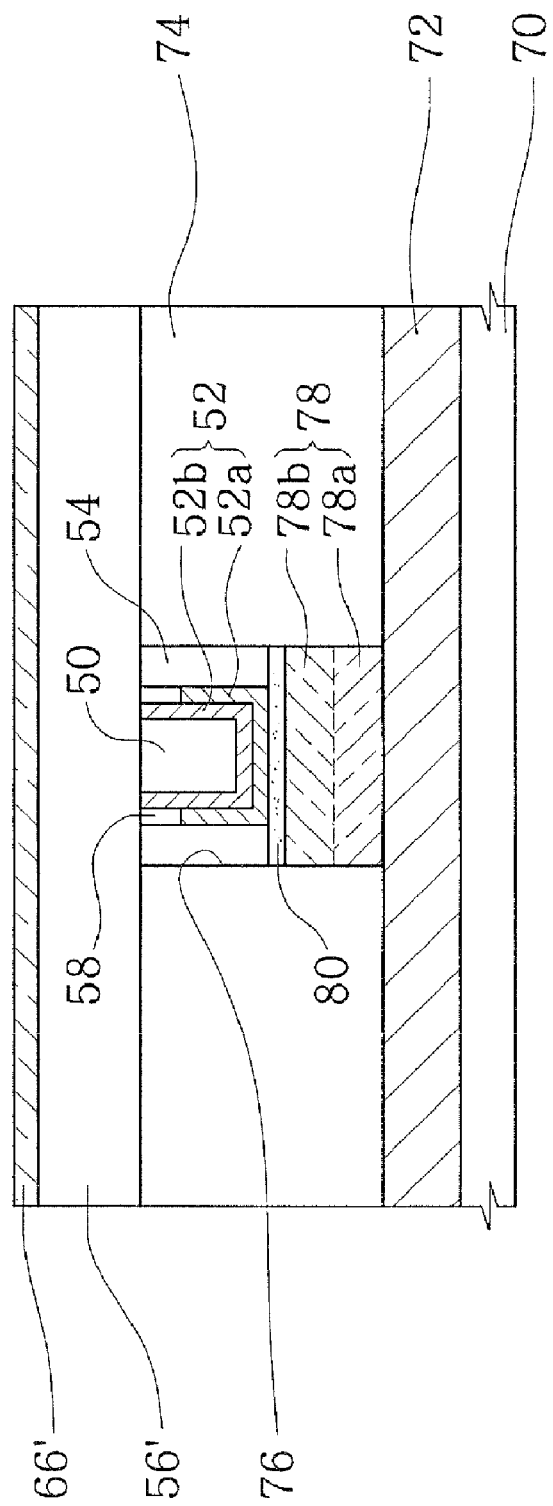

Referring to FIGS. 3 and 6A, a predetermined region of a semiconductor substrate 70 having a first conductivity type is etched to form an isolation layer defining an active region Impurity ions having a second conductivity type different from the first conductivity type are implanted into the active region to form a second impurity region, i.e., an interconnection 72. The interconnection 72 may serve as a word line. The first and second conductivity types may be P and N types, respectively. Alternatively, the first and second conductivity types may be N and P types, respectively.

The interconnection 72 may be formed by several other methods rather than the ion-implantation technique. For example, the interconnection 72 may be formed by an epitaxial technique. To be specific, an epitaxial semiconductor layer may be grown on the substrate 70 having the first conductivity type and then patterned to form an epitaxial semiconductor pattern. The epitaxial semiconductor pattern may be doped with second conductivity type impurities to form the interconnection 72.

A lower interlayer insulating layer 74 may be formed on the substrate having the interconnection 72. The lower interlayer insulating layer 74 may be formed of a single insulating layer and be patterned to form an opening 76 that exposes a predetermined region of the interconnection 72. A semiconductor layer may be formed within the opening 76. In one embodiment, the semiconductor layer may fill the opening 76 is formed. The semiconductor layer may be formed by a selective epitaxial growth technique in which the interconnection 72 exposed by the opening 76 is employed as a seed layer. Thus, when the interconnection 72 has a single crystal structure, the semiconductor layer may be formed to have a single crystal structure. The semiconductor layer may be planarized to form a preliminary semiconductor pattern having an even surface, which is disposed at the same level as a top surface of the lower interlayer insulating layer 74. In embodiments where the selective epitaxial growth process is performed using a silicon source gas, the semiconductor layer may be a silicon layer.

In other embodiments, the semiconductor layer may be formed by a chemical vapor deposition (CVD) technique. In such embodiments, the preliminary semiconductor pattern may be formed by planarizing the CVD semiconductor layer. The CVD semiconductor layer may be formed to have a polycrystalline state. Accordingly, carrier mobility of the CVD semiconductor layer may be smaller than that of the single crystal semiconductor layer formed by the selective epitaxial growth technique. However, the CVD process has a relatively larger process margin than the selective epitaxial growth process. Thus, when the semiconductor layer is formed by the CVD process, throughput of the process may be improved.

The preliminary semiconductor pattern may be partially etched to form a recessed semiconductor pattern having a lower surface than the top surface of the lower interlayer insulating layer 74. The first- or second-conductivity type impurity ions may be injected into a lower region of the recessed semiconductor pattern to form a first impurity region, i.e., a first semiconductor pattern 78a. Thus, the first semiconductor pattern 78a may have a first or second conductivity type. The first conductivity type impurity ions may be implanted into an upper region of the recessed semiconductor pattern to form a second impurity region, i.e., a second semiconductor pattern 78b. Thus, the second semiconductor pattern 78b may be formed to have the first conductivity type. The ion implantation process for forming the first semiconductor pattern 78a may be performed after the ion implantation process for forming the second semiconductor pattern 78b.

When the first semiconductor pattern 78a is doped with the second conductivity type impurity ions, the first and second semiconductor patterns 78a and 78b, which are sequentially stacked in the opening 76, constitute a cell diode 78. Alternatively, when the first semiconductor pattern 78a is doped with the first conductivity type impurity ions, the interconnection 72 and the first semiconductor pattern contacting the same constitute a cell diode.

Even when the first semiconductor pattern 78a is formed to have the first or second conductivity type, the first semiconductor pattern 78a may be doped to have a lower impurity concentration than the interconnection 72 and the second semiconductor pattern 78b. As a result, a leakage current characteristic of the cell diode may be improved when an inversed bias is applied to the cell diode.

A cell diode electrode 80 may be formed on a surface of the second semiconductor pattern 78b. The cell diode electrode 80 may, for example, include a metal silicide. For example, the cell diode electrode 80 may include cobalt silicide, nickel silicide, titanium silicide, or the like. The metal silicide layer may be formed by the silicide technology, which is well known to those skilled in the art.

Referring to FIGS. 3 and 6B-6D, the lower electrode 52, the phase change material layer 56' and the conductive barrier layer 66', which are described above, are formed on the substrate having the cell diode electrode 80. The detailed description on this is equal or similar to the above description, and thus it will be omitted.

Figure 6E:
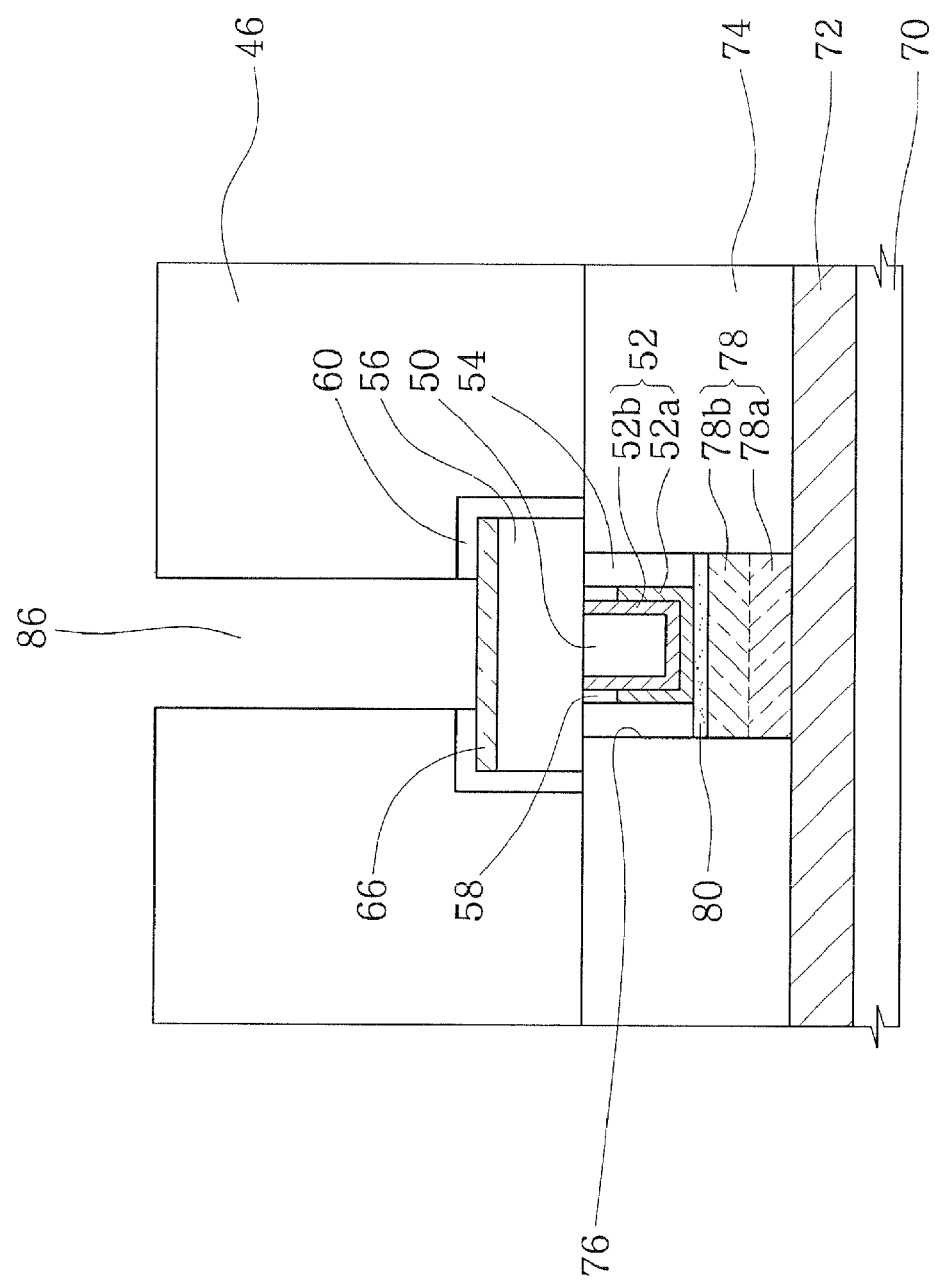

Referring to FIGS. 3 and 6E, the above-described upper interlayer insulating layer 46 is formed on the substrate 70 having the cell diode electrode 80 and the lower electrode 52. In the illustrated embodiment, the above-described phase change material pattern 56 is formed in the upper interlayer insulating layer 46. Then, the phase change memory device illustrated in FIG. 3 is formed. The detailed description on this is equal or similar to the above description, and thus it will be omitted.

According to the embodiments exemplarily described above, a cylindrical second conductive layer pattern and a first conductive layer pattern surrounding the sidewall and bottom of the second conductive layer pattern constitute a lower electrode of a phase change memory device. A top surface of the second conductive layer pattern of the lower electrode contacts phase change material and the first conductive layer pattern of the lower electrode is insulated from the phase change material. Accordingly, when a program current is applied to the phase change memory device, phase change efficiency within the phase change material may be improved.

In addition, because the first and second conductive layer patterns are electrically connected to a switching device of the phase change memory device, contact resistance between the lower electrode and the switching device may be relatively decreased.

Exemplary embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of fabricating a semiconductor device, comprising:
    forming an interlayer insulating layer on a semiconductor substrate;
    forming an opening within the interlayer insulating layer wherein the opening exposes the semiconductor substrate;
    sequentially forming first and second conductive layer patterns to cover a bottom surface and a sidewall of the opening;
    forming a buried insulating pattern within the opening and on the first and second conductive layer patterns;
    forming a phase change material pattern on the first and second conductive layer patterns, wherein the phase change material pattern contacts a top surface of the second conductive layer pattern and is spaced apart from a top surface of the first conductive layer pattern;
    forming a buffer pattern between the top surface of the first conductive layer pattern and a bottom surface of the phase change material pattern, wherein the buffer pattern comprises an oxide containing at least one element constituting the first conductive layer pattern; and
    forming a conductive plug electrically connected to the phase change material pattern,
    wherein the buffer pattern comprises titanium oxide, tantalum oxide or a combination thereof.

2. The method according to claim 1, wherein the first and second conductive layer patterns conformally cover the bottom surface and sidewall of the opening.

3. The method according to claim 1, wherein a top surface of the buffer pattern is substantially coplanar with the top surface of the second conductive layer pattern.

4. The method according to claim 1, wherein forming the buffer pattern is performed by thermally treating or plasma-treating the first conductive layer pattern at a temperature ranging from about 100° C. to about 500° C.

5. The method according to claim 1, wherein the first conductive layer pattern comprises a conductive material that oxidizes more readily than a material of the second conducive layer pattern.

6. The method according to claim 1, wherein the first conductive layer pattern comprises titanium, titanium nitride, tantalum layer or a combination thereof and the second conductive layer pattern comprises titanium aluminum nitride.

7. A method of fabricating a semiconductor device, comprising:
    forming an interlayer insulating layer on a semiconductor substrate;
    forming an opening within the interlayer insulating layer wherein the opening exposes the semiconductor substrate;
    sequentially forming first and second conductive layer patterns to cover a bottom surface and a sidewall of the opening;
    forming a buried insulating pattern within the opening and on the first and second conductive layer patterns;
    forming a phase change material pattern on the first and second conductive layer patterns, wherein the phase change material pattern contacts a top surface of the second conductive layer pattern and is spaced apart from a top surface of the first conductive layer pattern;
    forming a buffer pattern between the top surface of the first conductive layer pattern and a bottom surface of the phase change material pattern, wherein the buffer pattern comprises an oxide containing at least one element constituting the first conductive layer pattern; and
    forming a conductive plug electrically connected to the phase change material pattern,
    wherein the top surface of the second conductive layer pattern is lower than a top surface of the buffer pattern.

8. A method of fabricating a semiconductor device, comprising:
    forming an interlayer insulating layer on a semiconductor substrate;
    forming an opening in the interlayer insulating layer;
    forming a first conductive layer pattern on a bottom surface and sidewalls of the opening;
    forming a second conductive layer pattern on the first conductive layer pattern;
    forming a buried insulating pattern on the second conductive layer pattern;
    forming a metal oxide pattern on the first conductive layer pattern; and
    forming a phase change material pattern on the metal oxide pattern, the second conductive layer pattern, and the buried insulating pattern.

9. The method of claim 8, wherein the forming the metal oxide pattern on the first conductive layer pattern comprises thermally treating a top portion of the first conductive layer pattern.

10. The method according to claim 9, wherein thermally treating the top portion of the first conductive layer pattern includes oxidizing the top portion of the first conductive layer pattern.

11. The method according to claim 8, wherein the first conductive layer pattern and the metal oxide include the same metal.

* * * * *